United States Patent [19]

Schroeder

[11] Patent Number: 5,463,268
[45] Date of Patent: Oct. 31, 1995

[54] MAGNETICALLY SHIELDED HIGH VOLTAGE ELECTRON ACCELERATOR

[75] Inventor: James B. Schroeder, Madison, Wis.

[73] Assignee: National Electrostatics Corp., Middleton, Wis.

[21] Appl. No.: 247,261

[22] Filed: May 23, 1994

[51] Int. Cl.⁶ .................................................. H02N 1/00
[52] U.S. Cl. .................... 313/293; 313/297; 313/313; 315/85
[58] Field of Search ..................... 313/293, 297, 313/313; 315/85; 174/35 MS

[56] References Cited

U.S. PATENT DOCUMENTS

| | | | |
|---|---|---|---|
| 2,234,281 | 3/1941 | Rustka | 250/160 |
| 2,376,439 | 5/1945 | Machlett et al. | 250/27.5 |
| 2,559,526 | 7/1951 | VanDe Graaff | 313/330 |
| 2,578,908 | 12/1951 | Turner | 313/313 |
| 2,853,622 | 9/1958 | Hansen | 250/87 |
| 3,205,449 | 9/1965 | Udelson | 330/4.7 |
| 3,229,220 | 1/1966 | Udelson | 331/81 |
| 3,295,066 | 12/1966 | Anderson | 328/232 |
| 3,346,819 | 10/1967 | Birdsall | 330/44 |
| 3,355,614 | 11/1967 | Geiger et al. | 313/313 |
| 3,370,196 | 2/1968 | Dorgelo et al. | 313/162 |
| 3,469,118 | 9/1969 | Herb et al. | 310/6 |
| 3,473,056 | 10/1969 | Ferry | 310/6 |
| 3,609,218 | 9/1971 | Herb | 310/309 |
| 3,612,919 | 10/1971 | Herb et al. | 310/6 |
| 3,842,272 | 10/1974 | Coates et al. | 250/311 |
| 4,245,160 | 1/1981 | Harao | 313/239 |
| 4,675,145 | 6/1987 | Kusing et al. | 376/108 |
| 5,235,188 | 8/1993 | Mul | 250/311 |
| 5,280,413 | 1/1994 | Pai | 361/792 |

Primary Examiner—Donald J. Yusko
Assistant Examiner—Michael Day
Attorney, Agent, or Firm—Lathrop & Clark

[57] ABSTRACT

The high voltage electrostatic accelerator of this invention has spark arrester rings which form magnetic shield elements around an acceleration tube and which together with mu-metal rings between accelerator segments shield the electrons being accelerated from stray static and dynamic magnetic fields. The spark arresters surround the accelerating electrodes. The rings between accelerator segments are formed of mu-metal, an alloy of nickel designed for its magnetic shielding properties and consisting of 77 percent nickel, 4.8 percent copper, 1.5 percent chrome and 14.9 percent iron. The mu-metal spark arresters together with the rings between accelerators segments provide an effective magnetic shield in a cost-effective manner. Because mu-metal has a high permeability, magnetic field lines tend to travel about the Mu-metal rings rather than pass through the acceleration tube, where they would influence electrons being accelerated. The discontinuous nature of the shield allows it to be super-positioned as an integral part of the spark arresters positioned about the accelerating electrodes.

16 Claims, 4 Drawing Sheets

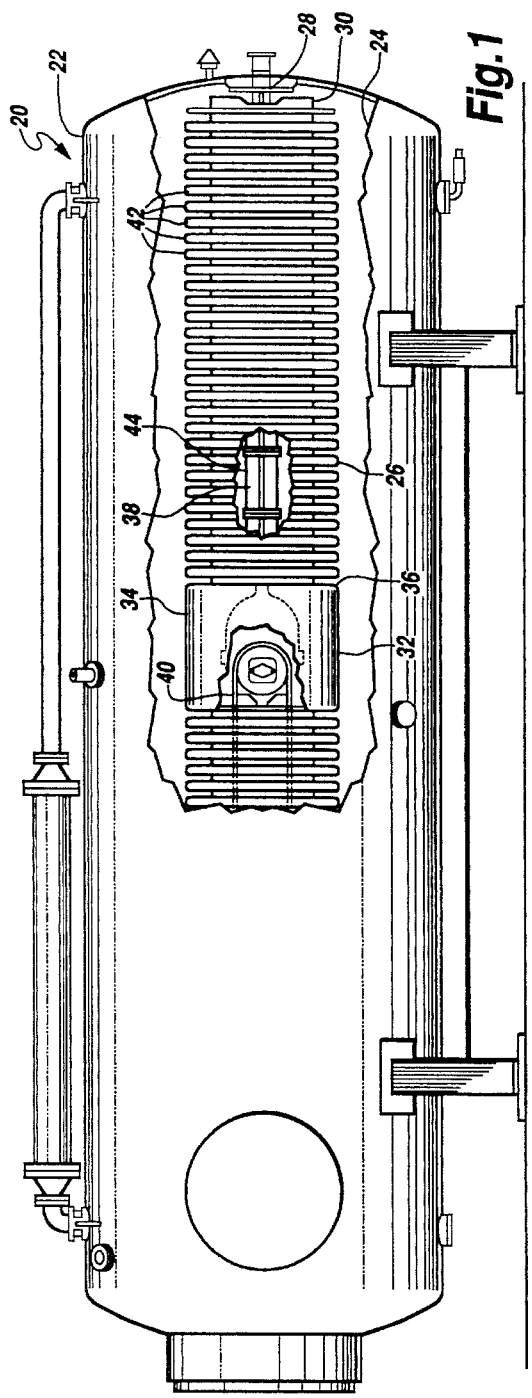
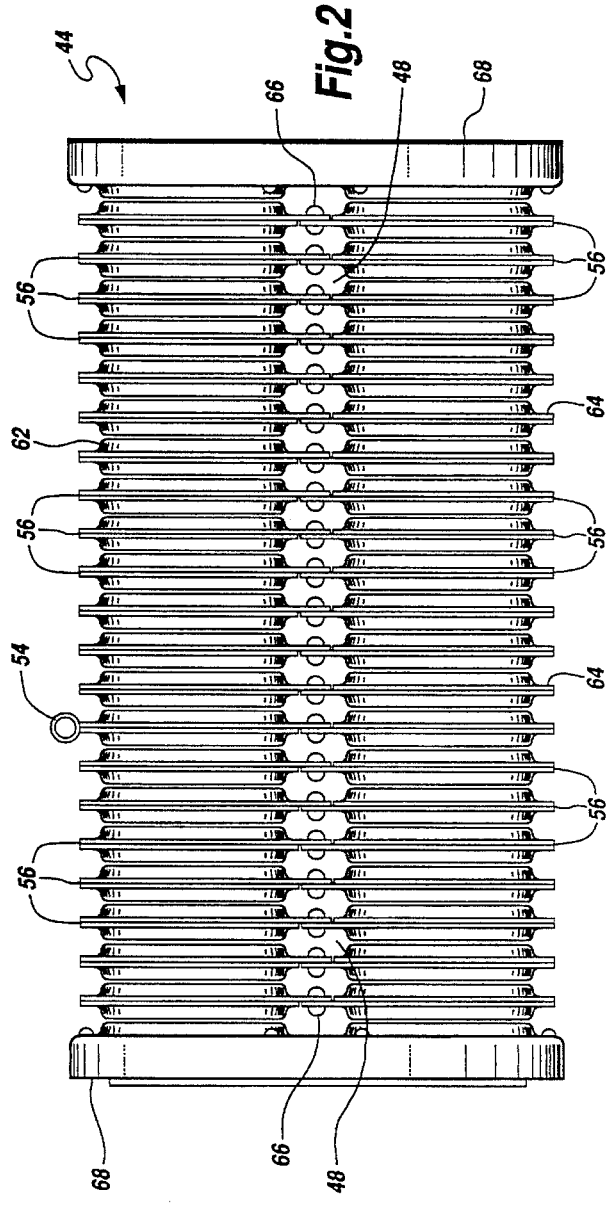

MAGNETICALLY SHIELDED HIGH VOLTAGE ELECTRON ACCELERATOR

FIELD OF THE INVENTION

This invention relates to particle accelerators in general and to electron accelerators in particular.

BACKGROUND OF THE INVENTION

In a conventional electrostatic generator, electric charge is accumulated on a high voltage electrode which is insulated from ground. The high voltage electrode is charged by an endless belt or chain which carries charge to the high voltage electrode. If a large negative charge is put on the high voltage electrode, the electric charge on the electrode can be used to accelerate electrons.

Electrostatic generators are capable of producing extremely high voltages ranging up to over twenty-five million volts. Such high voltage generators have been widely used for operating linear accelerating tubes in which protons, electrons, or other charged particles are accelerated to extremely high energies.

One use for high energy electrons is for the production of high energy x-rays which are used in industry for imaging the interior of rocket motor grains and heavy duty equipment. A high energy high brightness x-ray source is created by focusing a high energy electron beam on to a target of high atomic weight material. In creating a high energy source of electrons, a supply of electrons is fed to the acceleration tube which is positioned between the high voltage electrode and ground. A smooth voltage drop is developed along the acceleration tube by a multiplicity of charge carrying plates which are evenly spaced between the high voltage electrode and the ground. A high value resistor between successively spaced electrodes assures an even cascade of voltages so that the accelerating field is substantially constant between the high voltage electrode and the ground.

As electrons move along the linear acceleration tube, they are accelerated to high energies by the static potential field, developing an energy in electron volts equivalent to the static field through which they have been accelerated. The accelerating electrodes are normally spaced apart by insulating spacers bonded therebetween. The interior of the acceleration tube is maintained at a high vacuum to allow the free flow of electrons.

The tube and the entire electrostatic generator is normally contained within a pressure vessel containing high pressure gas, typically sulphur hexaflouride, which resists electrostatic breakdown between the accelerating electrodes and between the high voltage electrode and the ground. Circular rings are attached to the accelerating electrodes external to the acceleration tube. The rings serve as spark arresters which prevent arcing between the acceleration electrodes within the tube The rings typically have protrusions which extend length-wise in the direction of the potential field. The result of the protrusions is that a narrower gap exists between the spark arresting rings than between the accelerating electrodes themselves. The spark gap protrusions are spaced apart such that any arcing which takes place will be between the spark arresting tings rather than internal to the acceleration tube where the arcing could cause permanent damage to the function of the tube.

One problem that has arisen in the design of high voltage electrostatic accelerators for electrons is that the lower mass of the electrons per unit charge (approximately one two-thousandth that of a proton) makes the electrons unusually sensitive to small DC or low frequency magnetic fields. Because the electron tube is normally contained within a steel pressure vessel, a certain amount of magnetic shielding of the accelerator is performed by the metal casing. However, some sources of fluctuating magnetic fields are internal to the pressure vessel, such as the motors used to drive the static generators. Further, the pressure vessel itself may introduce stray magnetic fields produced by residual magnetic properties of the shield itself.

Electrostatic accelerators are used to produce high energy particle beams in a variety of applications. Because the particles in these accelerators are electrically charged, their trajectories can be altered by magnetic fields through which they travel. Indeed, this property is utilized by many devices for controlling charged particle beams. However, there are many sources of detrimental stray magnetic fields in accelerators such as: electric motors, generators, ferromagnetic or electromagnetic components, steel pressure vessels, or the earth itself. These fields can reroute the charged particle beams in a complex and unpredictable way making transmission of the beam to the desired target difficult or even impossible. They may cause the accelerator to malfunction. They can also reduce the beam quality by defocusing the beam or changing its position in a time-variant manner. These effects are deleterious to successful operation.

The consequences of the beam wandering away from its designed path are serious when beam power may exceed several kilowatts. At such power ranges, beam power is sufficient to almost immediately liquify the transmission tube, resulting in implosion of the accelerator tube with possible damage to the accelerator. Another undesirable consequences of the beam wandering is the generation of x-rays in a unshielded portion of the transmission tube.

One known solution to this problem is the placement of bending magnets to correct the deflections of the electron beam. However, this is effectual only for static deflections caused by static magnetic fields. Further, the necessity of correcting the beam in addition to focusing and deflecting it, adds complexity to the design of the beam handling magnets.

What is needed is a means for controlling or preventing the deflection of a high energy electron beam produced by an electrostatic accelerator.

SUMMARY OF THE INVENTION

The high voltage electrostatic accelerator of this invention uses a magnetic shielding material to fabricate the spark arresters and shield rings to form a magnetic shield around the acceleration tube which shields the electrons being accelerated from stray static and dynamic magnetic fields. The spark attesters which surround the accelerating electrodes are utilized to form part of a discontinuous magnetic shield. The spark attesters are typically manufactured of stainless steel however, the present invention obtains an economical and effective shield by employing mu-metal, to form the spark arresters and adding mu-metal rings between accelerator segments. Mu-metal is an alloy of nickel designed for its magnetic shielding properties and consisting of 77 percent nickel, 4.8 percent copper, 1.5 percent chrome and 14.9 percent iron.

Because the shield utilizes substantial existing structure, the complexities of engineering a shield within the high potential field of the accelerator is largely avoided. A continuous shield would of necessity have to be exterior to the entire acceleration column and electrode, and would not only require more of a relatively expensive material, but would be rendered substantially less effective as some sources of electromagnetic fields would still be contained within the shield.

Because mu-metal has a high permeability, magnetic field lines tend to travel about the rings rather than pass through the acceleration tube, where they would influence electrons being accelerated. The discontinuous nature of the shield allows it to be positioned, or more correctly super-positioned, as an integral part of the spark arresters positioned about the accelerating electrodes.

Although, as a general design principal, electromagnetic and magnetic shields must be continuous for maximum effectiveness, in practice discontinuities which are sufficiently smaller than the wavelength of the field which is being shielded against do not significantly degrade the performance of the shield. Because the magnetic shield employed in the electrostatic accelerator of this invention is subjected to static and low frequency magnetic fields, the discontinuous nature of the shield does not result in significant degradation of its performance.

It is an object of the present invention to provide an electron accelerator which is shielded from DC and low frequency magnetic fields.

It is an another object of the present invention to provide a magnetic shield for an electron acceleration tube.

Further objects, features, and advantages of the invention will be apparent from the following detailed description when taken in conjunction with the accompanying drawings.

BRIEF DESCRIPTION OF THE DRAWINGS

FIG. 1 is a side-elevational view, partially cut away, of the electron electrostatic accelerator of this invention.

FIG. 2 is an enlarged view of a segment of the acceleration tube of the accelerator of FIG. 1.

DESCRIPTION OF THE PREFERRED EMBODIMENT

Figure 3:
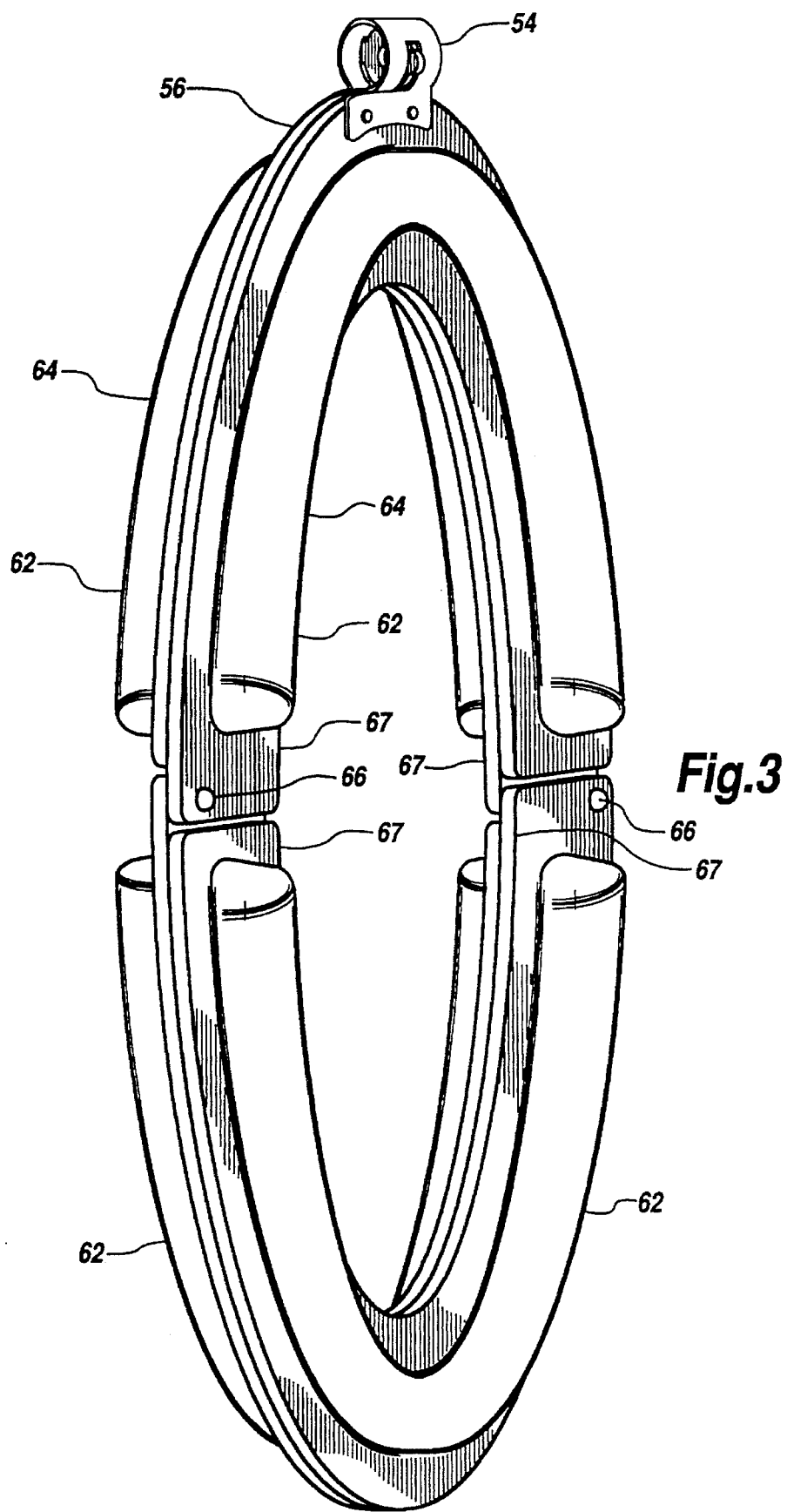
FIG. 3 is an isometric view of a single spark arrester of the acceleration tube of FIG. 2 constructed of mu-metal.

Referring more particularly to FIGS. 1–5, wherein like numbers refer to similar parts, a high voltage electrostatic accelerator 20 is shown in FIG. 1. The high voltage electron accelerator 20 has a pressure vessel 22 the interior 24 of which is filled with a high pressure insulating gas. Typically, sulphur hexaflouride is employed for its extremely high di-electric strength. An electron acceleration assembly 26 is mounted within the pressure vessel 22 between a right support member 28 and a left support member (not shown) which are in turn mounted to the pressure vessel 22. An insulative assembly 30 positions a high voltage electrode 32 between the support members 28. The high voltage electrode 32 is used to accumulate an electric charges which in turn produces a high voltage between the electrode 32 and the grounded support 28.

The illustrated high voltage electrode 32 has cylindrical wall portions 34 which merge smoothly into a hemispherically curved end portion 36. The construction of the high voltage electrode 32 is such that the possibility of sparks between the high voltage electrode and the pressure vessel 22 is minimized.

The electron acceleration assembly 26 is composed of insulating assemblies 30 which are capable of withstanding high voltage and are typically constructed of such highly insulating materials as plexiglas. Mounted to the insulating assembles are conductive rings 42. An accelerating tube 38 extends between the high voltage electrode 32 and the support member 28 which is mounted to the tank 22. The tank 22 and the support 28 are maintained at ground potential.

A high voltage is developed on the high voltage electrode 32 by conveying electrostatic charges to the electrode 32 by means of an endless conveyor chain 40 comprised of conductive links alternating with insulating links (not shown). This charging mechanism, disclosed more fully in U.S. Pat. Nos. 3,469,118; 3,473,056 and 3,612,919, which are incorporated herein by reference, is a much improved mechanism similar in function to the charging belt in a Van de Graaff electrostatic generator. It functions by transporting discrete quantities of electrostatic charge through the electrostatic potential between the high voltage electrode 32 and the left support (not shown) which is grounded to the vessel 22.

A smooth potential field between the high voltage electrode 32 and the grounded support 28 is established by the conductive tings 42 which are spaced along the insulating assembly 30. These conductive rings 42 are insulated from each other and serve to develop a uniform static electrical field between the high voltage electrode 32 and the grounded support 28.

Figure 4:
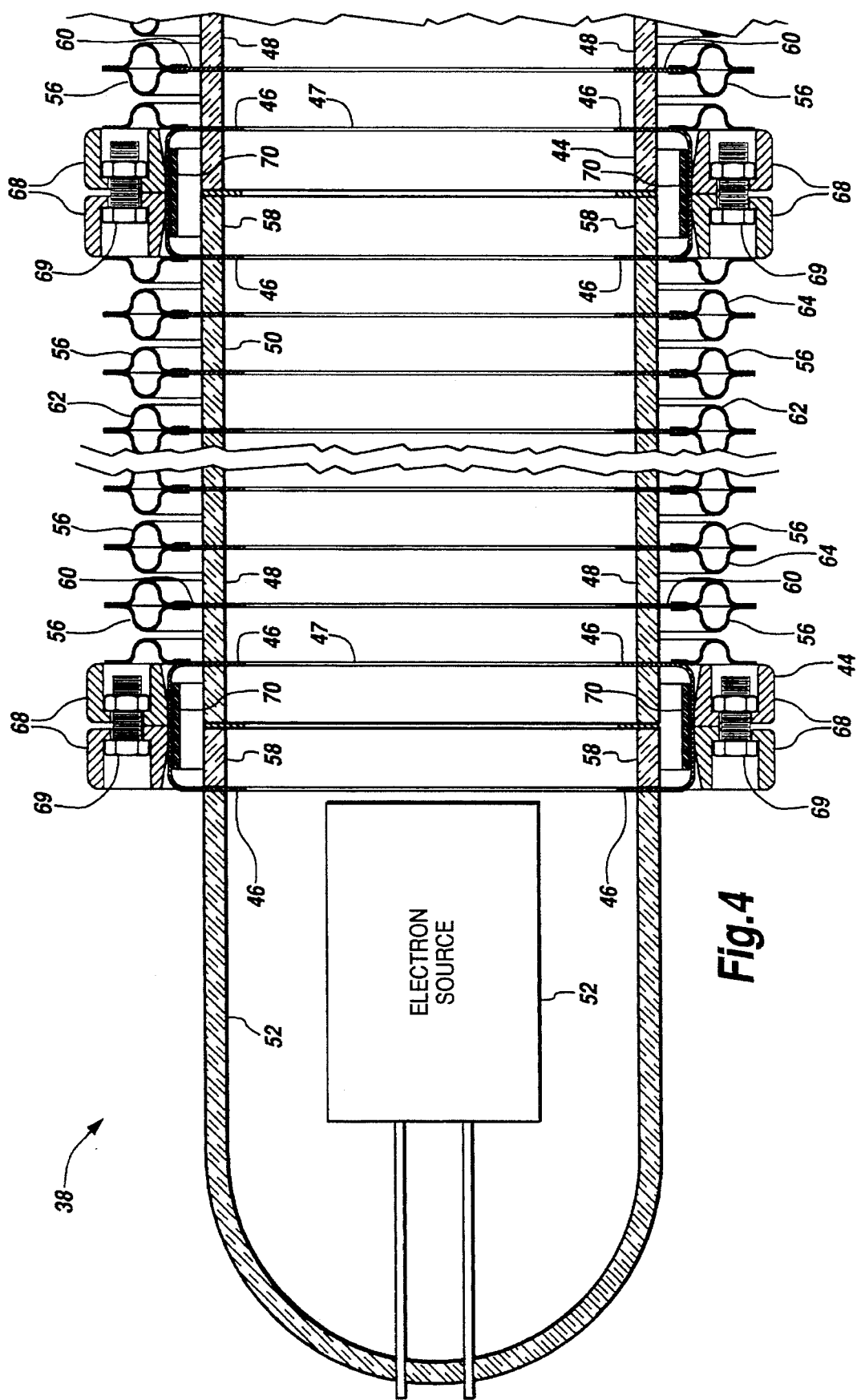
FIG. 4 is a schematic cross-sectional view of the electron accelerator of FIG. 1 illustrating the positioning of the spark arresters/mu-metal magnetic shields.

As shown in FIG. 1, the acceleration tube 38 is spaced within the rings 42 and is composed of segments 44, shown in FIGS. 1, 2 and 4.

Figure 5:
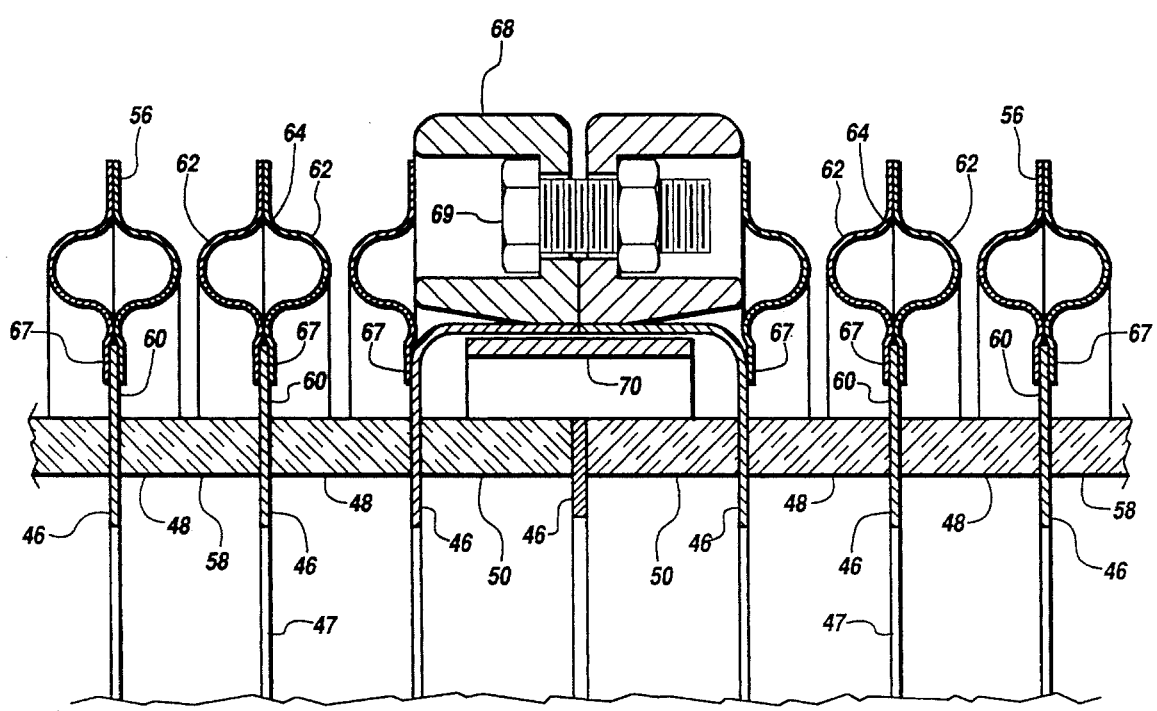
FIG. 5 is an enlarged cross-sectional view of area 5—5 of FIG. 4

As shown in FIG. 4 and FIG.5, the segments 44 are comprised of annular voltage-carrying metal rings 46 alternated with ceramic insulating rings 48. The interior 50 of the acceleration tube 38 is evacuated, typically to a pressure of at least $10^{-5}$ Torr to as high a vacuum as $10^{-8}$ Torr. A voltage for the acceleration of electrons, in the form of a large negative charge, is built up on the electrode 32. An electron source 52, shown schematically in FIG. 4, projects a beam of electrons down the center of the tube 38. The source 52 may be of any suitable design. One type of electron source 52 which may be used employs an electron emitter such as a heated barium oxide surface followed by a drift tube and a electrostatic lens which directs a stream of electrons into the accelerator tube 38. The electrons are accelerated as they move from the high voltage electrode 32 to the ground potential of the support member 28. The voltage on the metal tings 46 varies smoothly between the potential of the high voltage electrode 32 and the ground potential of the support member 28. The stepped progression of voltages is maintained by a series of high-valued resistors (not shown) connected between spark arresters 56. The resistors (not shown) are mounted to brackets 54 on the spark arresters 56, best shown in FIGS. 2 and 3.

The metal rings 46, normally formed of titanium for its resistance to arc erosion, have varying central apertures 47 which are used to focus the electron beam by shaping the field within the acceleration tube 38.

Normally, in an electrostatic accelerator of this type, a certain amount of arcing takes place between the metal rings 46, especially during initial start-up operations of the accelerator 20. To prevent the arcing from taking place on the inside 50 of the accelerator tube 38, where the arcing may cause destructive plating of the plate metal on the insides 58 of the ceramic rings 48, spark arresters 56 are slipped over the exteriorly extending flanges 60 of the metal rings 46.

The spark arresters 56 are typically formed of thin gauge sheet metal of fifteen to twenty thousandths of an inch thickness and which have raised, smooth protrusions 62 which, when closely spaced along the acceleration tube 38, as shown in FIGS. 2 and 4, provide an external path for sparks which is not detrimental to the operation of the accelerator 20. The spark arresters are formed by spot welding two opposed stampings 64 into halves which are pivotally assembled by rivets 66 which join the two halves about the metal rings 46. The stampings have flanges 67 which extend on either side of a ring 46.

It is known in the art to fabricate spark arresters of outward appearance as shown in FIG.3 of thin gauge stainless steel. However in order for the spark arresters 56 to function as a magnetic shield they must be composed of mu-metal or the like. Further shield rings 70 will preferably be added to the acceleration tube 38, to cover the gap formed by the segment attachment rings 68 as shown in FIG. 4 and 5. For ease of assembly, the acceleration tube 38 is assembled from segments 44. The segment attachment tings 68 are bolted together by bolts 69 which crush an aluminum gasket (not shown) between the segment attachment rings 68 to form a vacuum tight seal.

The spark arrester 56 shown in FIGS. 2, 3, 4 and 5 and shield rings 70 shown in FIGS. 4 and 5 are fabricated of mu-metal. Mu-metal is a nickel/iron alloy designed for magnetic shielding and for use in magnetic amplifier cores. Mu-metal typically contains approximately eighty percent nickel and twenty percent iron. The iron/nickel alloys have a high initial permeability. In the iron/nickel alloy system, the maximum permeability occurs around seventy-seven percent nickel between the composition which corresponds to zero magnetocrystalline anisotropy (approximately seventy-five percent nickel) and one corresponding to $\lambda_{III}=0$ just below eighty percent nickel. Typical composition of mu-mental is, for example, 77 percent nickel, 4.5 percent copper, 1.5 percent chromium and 14.9 percent iron. Another formulation is 77 percent nickel, 5 percent copper, 1.5 percent chromium with the remainder iron and impurities.

A typical accelerator is used to accelerate ions. The smallest ion, a single proton, has a mass of approximately two thousand times that of an electron. A particle's response to a magnetic field is related to its electrical charge and to its mass. Thus, electrons which have a charge of −1 and a rest mass of approximately one two-thousandth of a proton are much more sensitive to deflections by magnetic fields than are protons, the second lightest charged particle. Thus the problem of deflection of an electron beam is much more of a concern in an electron accelerator as opposed to an ion accelerator.

The steel pressure vessel, shown in FIG. 1, functions to some extent as a magnetic shield. However, being constructed of steel, it itself has residual magnetic fields. Further, the motor (not shown) which drives the charge-carrying belt 40 and other equipment located within the pressure vessel create relatively low frequency alternating magnetic fields.

Because a magnetic shield must be constructed of metal and because no continuous metal structure can be placed between the high voltage electrode 32 and the grounded support 28, a conventional magnetic shield would necessarily be completely external to the electron acceleration assembly 26 shown in FIG. 1. However, any external shielding cannot shield the acceleration tube 38 from magnetic fields produced adjacent to it. Further, an exterior shield requires a considerable quantity of shielding material.

Conventional concepts of shielding are based upon the complete enclosure of an element to be shielded by a surface of shielding material. However, a shield which has gaps or holes which do not exceed some small fraction of the wavelength of interest for shielding purposes, will form effective shields for static and low frequency magnetic fields despite their discontinuous nature. Thus, the fabrication of the spark arresters 56 of mu-metal and the addition of shield tings 70 also constructed of mu-metal results in a magnetic shield closely spaced about the acceleration tube 38 which is effective against the static and relatively low frequency magnetic fields to which the electron beam within the tube 38 is subjected.

The general solution to stray magnetic field problems is to shroud the beam path with a continuous sheet of a material which is formulated to shunt magnetic fields. Alloys composed largely of nickel and iron are commonly used. In the case of the accelerator, however, this approach cannot be used. Inside the accelerator the charged particle beam travels through an evacuated acceleration tube. This tube must be constructed from electrically insulating materials to support the high electric field used to accelerate the particle beam. Magnetic shielding materials are electrical conductors, not insulators, and therefore a continuous shield cannot be applied.

The invention resolves this difficulty by providing a segmented magnetic shield which maintains the insulating properties of the acceleration tube while protecting the charged particle beam from the effects of external magnetic fields. The individual segments are fabricated from magnetic shielding alloy each consisting of a complete annulus which surrounds the acceleration tube. The spaces between the segments are kept small in proportion to the tube diameter to prevent magnetic fields from penetrating or fringing into the interior of the tube.

In the accelerator 20 magnetic shield elements 56 are attached to each electrode on the acceleration tube 38. Also, in this case, the shield elements 56 serve as spark gaps which protect the insulators 48 from damage during discharges. The details of the assembly are not essential for the purposes of the present invention, it being understood that a segmented magnetic shield could be applied to acceleration tubes of other designs and manufacture.

It should be understood that the accelerator 20 is constructed for horizontal placement. However a vertically placed accelerator is possible. Such an accelerator would need to be supported only on one end and would therefore have an acceleration assembly extending from one support to the high voltage electrode.

It should be understood that the invention is not limited to the particular construction and arrangement of parts herein illustrated and described, but embraces such modified forms thereof as come within the scope of the following claims.

I claim:

1. A magnetically shielded high voltage electron accelerator comprising:

an electron source;

a high voltage vacuum tube for accelerating electrons, wherein the tube for accelerating electrons is composed of a plurality of segments, and wherein each segment has a plurality of axially spaced annular insulating elements and a plurality of annular voltage-carrying elements, and at least one segment attachment ring, and wherein a plurality of first magnetic shield elements formed of a high magnetic permeability material are connected to each vacuum tube segment, each magnetic shield element being connected to a voltage carrying element, the first magnetic shield elements being closely spaced along each segment, wherein the connected segments of the vacuum tube abut at connected segment attachment rings to form joints, and wherein the first magnetic shield elements are closely spaced along the vacuum tube and not continuous with each other, the first magnetic shield elements forming a magnetic shield along each vacuum tube segment; and second magnetic shield element formed of a high magnetic permeability material which extends across each joint between connected vacuum tube segments.

2. The apparatus of claim 1 wherein the first and second magnetic shield elements are made from mu-metal.

3. The apparatus of claim 2 wherein the first and second magnetic shield elements are made from a metal comprised of between 20 and 25 percent iron.

4. The apparatus of claim 1 wherein the first and second magnetic shield elements are made from a metal comprised of between 75 and 80 percent nickel.

5. In a high voltage electrostatic accelerator having a pressure vessel filled with high pressure insulating gas, a support member within the pressure vessel, an insulated high voltage electrode spaced a substantial distance from said support, and an acceleration tube extending from the high voltage electrode to the support member, the tube being composed of it multiplicity of insulating segments and a multiplicity of voltage carrying plates, each plate being connected to a metal spark arrester ring surrounding the tube, the tube for accelerating electrons being composed of a plurality of segments having segment attachment rings which abut to form joints, the segments being composed of the insulating elements and the annular voltage-carrying elements; wherein the improvement comprises:

forming the spark arrester metal tings of a material of high magnetic permeability, so shielding the acceleration tube from magnetic fields; and a magnetic shield ring formed of the high magnetic permeability material, which extends across each joint formed by the segment attachment rings.

6. The apparatus of claim 5 wherein the material of high magnetic permeability is mu-metal.

7. The apparatus of claim 5 wherein the material of high magnetic permeability is a metal comprised of between 75 and 80 percent nickel.

8. The apparatus of claim 5 wherein the material of high magnetic permeability is a metal comprised of between 20 and 25 percent iron.

9. A magnetically shielded high voltage electron accelerator comprising:

a) a pressure vessel filled with high pressure insulating gas;

b) a support member within the pressure vessel;

c) an insulated high voltage electrode spaced a substantial distance from said support;

e) an electron source spaced within the electrode;

f) a high voltage vacuum tube for accelerating electrons which extends from the high voltage electrode to the support member and which is comprised of a plurality of segments, wherein each segment is comprised of a plurality of connected annular insulating elements and annular voltage-carrying elements, and each voltage-carrying element has a first means for magnetically shielding formed of a high magnetic permeability material, and wherein the voltage-carrying elements of each segment are closely spaced along the vacuum tube to form a low frequency magnetic shield;

g) at least one segment attachment ring on each vacuum tube segment, wherein the segment attachment rings of connected segments abut to form joints; and h) a second means for extending a magnetic shield across the joints formed by the connected segments.

10. The apparatus of claim 9 wherein the first means for magnetically shielding and the second means for extending a magnetic shield are formed of mu-metal.

11. The apparatus of claim 9 wherein the first means for magnetically shielding and the second means for extending a magnetic shield are formed of a metal comprised of between 75 and 80 percent nickel.

12. The apparatus of claim 11 wherein the first means for magnetically shielding and the second means for extending a magnetic shield are formed of a metal comprised of between 20 and 25 percent iron.

13. In combination with a high voltage electron accelerator of the type having an electron source a high voltage vacuum tube for accelerating electrons composed of segments of connected axially spaced annular insulating elements and annular voltage-carrying elements each segment having a segment attachment ring, such that adjacent segments of the vacuum tube are connected at joints defined between adjacent segment attachment rings, and wherein each voltage-carrying element has a spark arrester attached thereto, the improvement comprising:

a) forming the spark arrester of a high magnetic permeability material; and b) a ring of high magnetic permeability material positioned across the joints between the segment attachment rings to form a magnetic shield which extends along the vacuum tube.

14. The apparatus of claim 13 wherein the material of high magnetic permeability is mu-metal.

15. The apparatus of claim 13 wherein the material of high magnetic permeability is a metal comprised of between 75 and 80 percent nickel.

16. The apparatus of claim 15 wherein the material of high magnetic permeability is a metal comprised of between 20 and 25 percent iron.

* * * * *

UNITED STATES PATENT AND TRADEMARK OFFICE
CERTIFICATE OF CORRECTION

PATENT NO. : 5,463,268
DATED : October 31, 1995
INVENTOR(S) : James B. Schroeder It is certified that error appears in the above-indentified patent and that said Letters Patent is hereby corrected as shown below:

In column 1, line 63 of the issued patent, delete "tings" and substitute --rings-- therefor.

In column 4, line 53 of the issued patent, delete "tings" and substitute --rings-- therefor.

In column 5, line 24 of the issued patent, delete "tings" and substitute --rings-- therefor.

In column 6, line 14 of the issued patent, delete "tings" and substitue --rings-- therefor.

In column 7, line 33 of the issued patent, delete "it multiplicity" and substitute --a multiplicity-- therefor.

In column 7, line 41 of the issued patent, delete "metal tings" and substitute --metal rings-- therefor.

Signed and Sealed this

Fifteenth Day of October, 1996

Attest:

BRUCE LEHMAN

Attesting Officer         Commissioner of Patents and Trademarks